US012640191B2

(12) United States Patent
Bedeschi et al.

(10) Patent No.: US 12,640,191 B2
(45) Date of Patent: May 26, 2026

(54) MEMORY ARRAY WITH MULTIPLEXED DIGIT LINES

(71) Applicant: Micron Technology, Inc., Boise, ID (US)

(72) Inventors: Ferdinando Bedeschi, Biassono (IT); Stefan Frederik Schippers, Peschiera del Garda (IT)

(73) Assignee: Micron Technology, Inc., Bosie, ID (US)

( * ) Notice: Subject to any disclaimer, the term of this patent is extended or adjusted under 35 U.S.C. 154(b) by 113 days.

(21) Appl. No.: 18/421,741

(22) Filed: Jan. 24, 2024

(65) Prior Publication Data

US 2024/0242758 A1 Jul. 18, 2024

Related U.S. Application Data

(62) Division of application No. 17/370,488, filed on Jul. 8, 2021, now Pat. No. 11,900,989, which is a division (Continued)

(51) Int. Cl.
*G11C 11/24* (2006.01)
*G11C 11/408* (2006.01)
(Continued)

(52) U.S. Cl.
CPC ...... *G11C 11/4096* (2013.01); *G11C 11/4085* (2013.01); *G11C 11/4091* (2013.01);
(Continued)

(58) Field of Classification Search
CPC ............ G11C 11/4096; G11C 11/4085; G11C 11/4091; G11C 11/4087; G11C 11/565; H10B 12/30; H10B 12/50
(Continued)

(56) References Cited

U.S. PATENT DOCUMENTS 4,704,705 A 11/1987 Womack
5,771,189 A 6/1998 Jun et al.
(Continued)

FOREIGN PATENT DOCUMENTS

CN 1503367 A 6/2004
CN 102646445 A 8/2012
(Continued)

OTHER PUBLICATIONS

European Patent Office, "Supplementary European search report," issued in connection with European Patent Application No. 20787018.9 dated Nov. 9, 2022 (8 pages).

(Continued)

*Primary Examiner* — Viet Q Nguyen
(74) *Attorney, Agent, or Firm* — Holland & Hart LLP

(57) ABSTRACT

Methods, systems, and devices for a memory device with multiplexed digit lines are described. In some cases, a memory cell of the memory device may include a storage component and a selection component that includes two transistors. A first transistor may be coupled with a word line and a second transistor may be coupled with a select line to selectively couple the memory cell with a digit line. The selection component, in conjunction with a digit line multiplexing component, may support a sense component common to a set of digit lines. In some cases, the digit line of the set may be coupled with the sense component during a read operation, while the remaining digit lines of the set are isolated from the sense component.

18 Claims, 9 Drawing Sheets

Related U.S. Application Data of application No. 16/379,222, filed on Apr. 9, 2019, now Pat. No. 11,062,763.

(51) Int. Cl.

| | |
|---|---|
| *G11C 11/4091* | (2006.01) |
| *G11C 11/4096* | (2006.01) |
| *H10B 12/00* | (2023.01) |
| *G11C 11/56* | (2006.01) |

(52) U.S. Cl.

CPC ............. *H10B 12/30* (2023.02); *H10B 12/50* (2023.02); *G11C 11/4087* (2013.01); *G11C 11/565* (2013.01)

(58) Field of Classification Search

USPC ........................................................ 365/149

See application file for complete search history.

(56) References Cited

U.S. PATENT DOCUMENTS

| | | | |
|---|---|---|---|
| 6,809,949 B2 * | 10/2004 | Ho ......................... | G11C 11/22 |
| | | | 365/145 |
| 7,120,046 B1 | 10/2006 | Forbes | |
| 7,269,048 B2 * | 9/2007 | Takashima .............. | G11C 11/22 |
| | | | 365/230.03 |
| 7,391,640 B2 | 6/2008 | Tang et al. | |
| 7,397,319 B2 * | 7/2008 | Gomez ................. | H03D 7/165 |
| | | | 331/34 |
| 8,619,471 B2 | 12/2013 | Tanzawa | |
| 8,995,180 B2 | 3/2015 | Romanovskyy | |
| 9,865,342 B2 * | 1/2018 | Lee .................... | G11C 13/0026 |
| 10,056,386 B2 | 8/2018 | Mathew et al. | |
| 10,074,414 B2 | 9/2018 | Derner et al. | |
| 10,079,235 B2 | 9/2018 | Mathew et al. | |
| 10,083,973 B1 | 9/2018 | Matsubara | |
| 10,127,965 B2 | 11/2018 | Kawamura et al. | |
| 10,127,972 B2 | 11/2018 | Kawamura et al. | |
| 10,153,018 B2 | 12/2018 | Derner et al. | |
| 10,153,281 B2 | 12/2018 | Derner et al. | |
| 10,157,926 B2 | 12/2018 | Yang et al. | |
| 10,163,480 B1 | 12/2018 | Kawamura et al. | |
| 10,304,514 B2 | 5/2019 | Muzzetto | |
| 10,388,361 B1 * | 8/2019 | Vimercati ............. | G11C 11/221 |
| 10,468,081 B2 | 11/2019 | Niki | |
| 10,790,286 B2 | 9/2020 | Juengling | |
| 10,867,653 B2 * | 12/2020 | Matsubara .......... | G11C 11/2273 |
| 10,896,717 B2 | 1/2021 | Derner et al. | |
| 11,031,400 B2 | 6/2021 | Derner et al. | |
| 11,393,822 B1 * | 7/2022 | Vimercati ............. | G11C 11/408 |
| 11,790,970 B2 * | 10/2023 | Bedeschi ............. | H10B 12/315 |
| | | | 365/145 |
| 12,353,762 B2 * | 7/2025 | Yudanov .................. | G11C 7/08 |
| 2001/0014047 A1 | 8/2001 | Hidaka et al. | |
| 2003/0062905 A1 | 4/2003 | Kollmer et al. | |
| 2004/0013017 A1 | 1/2004 | Takashima | |
| 2004/0100835 A1 | 5/2004 | Sugibayashi et al. | |
| 2004/0151020 A1 | 8/2004 | Beer | |
| 2005/0002247 A1 | 1/2005 | Kamoshida et al. | |
| 2006/0187706 A1 | 8/2006 | Tang et al. | |
| 2006/0249776 A1 | 11/2006 | Manning et al. | |
| 2007/0109886 A1 | 5/2007 | Terzioglu et al. | |
| 2007/0263466 A1 | 11/2007 | Morishita et al. | |
| 2009/0225584 A1 | 9/2009 | Rao | |
| 2012/0213028 A1 | 8/2012 | Ting | |
| 2012/0250441 A1 | 10/2012 | Roy et al. | |
| 2012/0250442 A1 | 10/2012 | Roy et al. | |
| 2013/0114330 A1 | 5/2013 | Takemura | |
| 2016/0276409 A1 | 9/2016 | Liu et al. | |
| 2017/0316820 A1 | 11/2017 | Kumar et al. | |
| 2017/0352418 A1 | 12/2017 | Bertin et al. | |
| 2018/0102365 A1 | 4/2018 | Van et al. | |
| 2019/0067206 A1 | 2/2019 | Bedeschi et al. | |
| 2019/0067288 A1 | 2/2019 | Juengling | |
| 2020/0052070 A1 | 2/2020 | Derner et al. | |

FOREIGN PATENT DOCUMENTS

| | | | |
|---|---|---|---|
| JP | 62-078799 A | | 4/1987 |
| JP | 2004-111602 A | | 4/2004 |
| JP | 2009259337 A | * | 11/2009 |
| TW | 201727642 A | | 8/2017 |
| TW | 201824274 A | | 7/2018 |
| TW | 201842649 A | | 12/2018 |
| WO | 2019/046051 A1 | | 3/2019 |

OTHER PUBLICATIONS

International Search Report and Written Opinion received for PCT Patent Application No. PCT/US20/22098, mailed on Jul. 2, 2020, 11 pages.

Japan Patent Office, "Office Action," issued in connection with Japan Patent Application No. 2021-559536 dated Dec. 6, 2022 (21 pages) (11 pages of English Translation and 10 pages of Original Document).

Taiwan Intellectual Property Office, "Office Action," issued in connection with ROC (Taiwan) Patent Application No. 109109364, dated Jan. 20, 2021 (3 pages).

U.S. Appl. No. 62/641,057, entitled "Pseudo-Non-Volatile Memory Cells," filed Mar. 9, 2018 (35 pages).

U.S. Appl. No. 62/717,629, entitled "Integrated Memory Comprising Gated Regions Between Charge-Storage Devices and Access Devices," filed Aug. 10, 2018 (31 pages).

U.S. Appl. No. 62/717,636, entitled "Integrated Memory Comprising Secondary Access Devices Between Digit Lines and Primary Access Devices," (27 pages), filed Jul. 17, 2019.

Chinese patent office, "China Office Action," issued in connection with China Patent Application No. 202080032423.5 dated Oct. 31, 2024 (24 pages) (11 pages of English Translation and 13 pages of Original Document).

* cited by examiner 265-a
265-b
265-c
265-d 205-a
205-b
205-c
205-d 210-a 206-d
207-d
208-d 215-a
215-b
215-c
215-d 210-b 260-a
260-b
260-c
260-d 270-a
271-a
271-b
270-b
271-c
271-d 245-a
245-b

200

465-a 482-a 460-a 481-a 410-a 415-a 406-a 408-a 407-a 405-a 404-a

| | | |
|---|---|---|
| ▨ Word line | ▦ First doped region | |
| ▦ Plate line | ▦ Second doped region | |
| ▨ Select line | ▦ First storage component material | |
| ▦ Digit line | ▨ Second storage component material | |
| ▥ Substrate | | |

401

465-b
482-b
460-b
408-b
406-b
405-b
481-b
410-b
407-b
415-b 404-b

| | Word line | | First doped region |
|---|---|---|---|
| | Plate line | | Second doped region |
| | Select line | | First storage component material |
| | Digit line | | Second storage component material |
| | Substrate | | |

402

- ▨ Sense component
- ▨ Sub-word line driver (SWD)
- ▨ Digit line multiplexing component
- ▨ Digit line multiplexing component driver

500

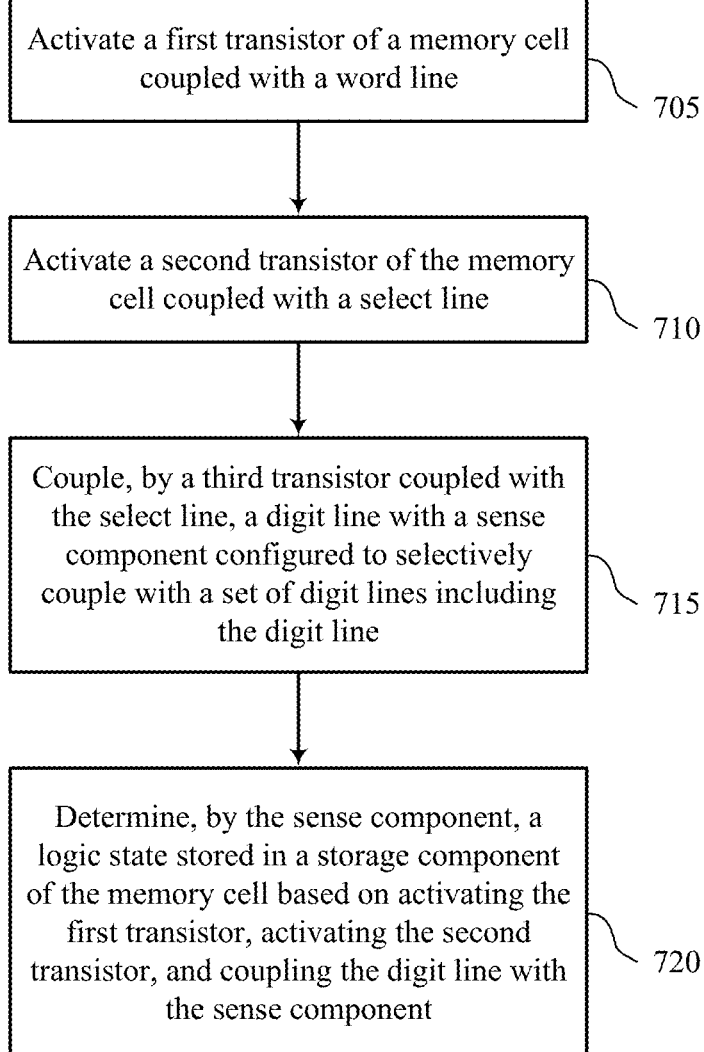

Activate a first transistor of a memory cell coupled with a word line

705

Activate a second transistor of the memory cell coupled with a select line

710

Couple, by a third transistor coupled with the select line, a digit line with a sense component configured to selectively couple with a set of digit lines including the digit line

715

Determine, by the sense component, a logic state stored in a storage component of the memory cell based on activating the first transistor, activating the second transistor, and coupling the digit line with the sense component

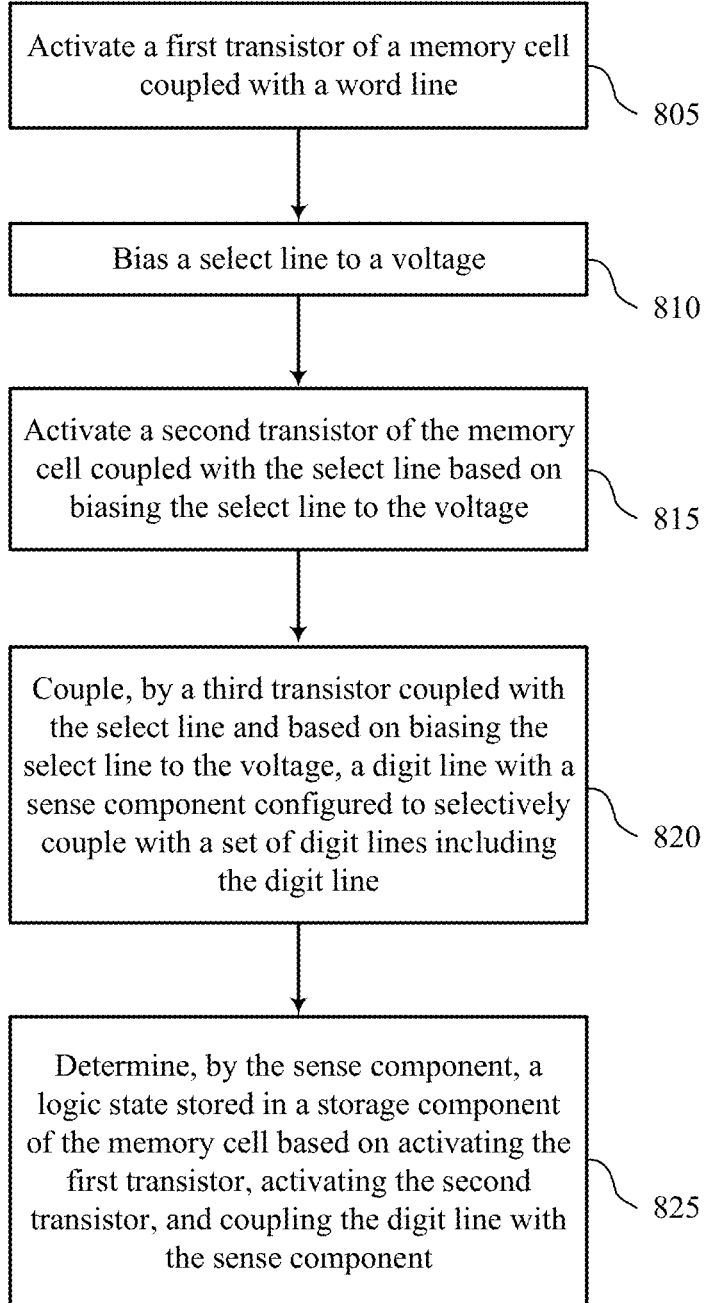

Activate a first transistor of a memory cell coupled with a word line

805

Bias a select line to a voltage

810

Activate a second transistor of the memory cell coupled with the select line based on biasing the select line to the voltage

815

Couple, by a third transistor coupled with the select line and based on biasing the select line to the voltage, a digit line with a sense component configured to selectively couple with a set of digit lines including the digit line

820

Determine, by the sense component, a logic state stored in a storage component of the memory cell based on activating the first transistor, activating the second transistor, and coupling the digit line with the sense component

MEMORY ARRAY WITH MULTIPLEXED DIGIT LINES

CROSS REFERENCE

The present Application for Patent is a divisional of U.S. patent application Ser. No. 17/370,488 by Bedeschi et al., entitled "MEMORY ARRAY WITH MULTIPLEXED DIGIT LINES," filed Jul. 8, 2021, which is a divisional of U.S. patent application Ser. No. 16/379,222 by Bedeschi et al., entitled "MEMORY ARRAY WITH MULTIPLEXED DIGIT LINES," filed Apr. 9, 2019, each of which is assigned to the assignee hereof, and is expressly incorporated by reference in its entirety herein.

BACKGROUND

The following relates generally to a memory device and more specifically to a memory array with multiplexed digit lines.

Memory devices are widely used to store information in various electronic devices such as computers, wireless communication devices, cameras, digital displays, and the like. Information is stored by programing different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving memory devices, generally, may include increasing memory cell density, increasing read/write speeds, increasing reliability, increasing data retention, reducing power consumption, or reducing manufacturing costs, among other metrics. Improved solutions for saving space in the memory array, increasing the memory cell density, or decreasing overall power usage of the memory array may be desired.

BRIEF DESCRIPTION OF THE DRAWINGS

FIGS. 7 and 8 show flowcharts illustrating a method or methods that support a memory array with multiplexed digit lines in accordance with examples as disclosed herein.

DETAILED DESCRIPTION

Some memory devices may include an array of memory cells coupled with digit lines. As distances between digit lines decrease to increase a density of the array, some undesired effects (e.g., disturbs) may increase. For example, when a digit line is activated (e.g., coupled with a memory cell), a voltage change associated with the activated digit line may be partially transferred (e.g., capacitively coupled) to neighboring digit lines. As a result, logic states of memory cells coupled with the neighboring digit lines may be adversely impacted (e.g., disturbed), in some cases. Each memory cell of the array may include a selection component (e.g., switching component) that may include two or more transistors to mitigate such undesired effects. The first transistor may be activated based on biasing a word line and the second transistor may be activated based on biasing a select line. The selection component may be configured to isolate the other memory cells from the neighboring digit lines during a read operation and mitigate or reduce disturbances, for example, on non-selected digit lines and non-selected memory cells. In some cases, the transistors of the selection component may be examples of vertical transistors to save space and conserve resources.

A sense component of memory device may be coupled with a set of digit lines. In such cases, the set of digit lines may be multiplexed with the input of the sense component. For example, each digit line of the set may be coupled with a transistor (e.g., a third transistor) configured to selectively couple that particular digit line of the set with the sense component—e.g., multiplexed digit lines associated with the sense component. Further, a select line may be coupled with one of the transistors of the selection component of a memory cell and the multiplexing component associated with the sense component. In such examples, a circuit design of the sense component may be more complex because the sense component may be configured to support more than one digit line.

Features of the disclosure are initially described in the context of a memory die as described with reference to FIG. 1. Features of the disclosure are described in the context of circuit diagrams and memory cell structures as described with reference to FIGS. 2-5. These and other features of the disclosure are further illustrated by and described with reference to an apparatus diagram and flowcharts that relate to a memory array with multiplexed digit lines as described with references to FIGS. 6-8.

Figure 1:
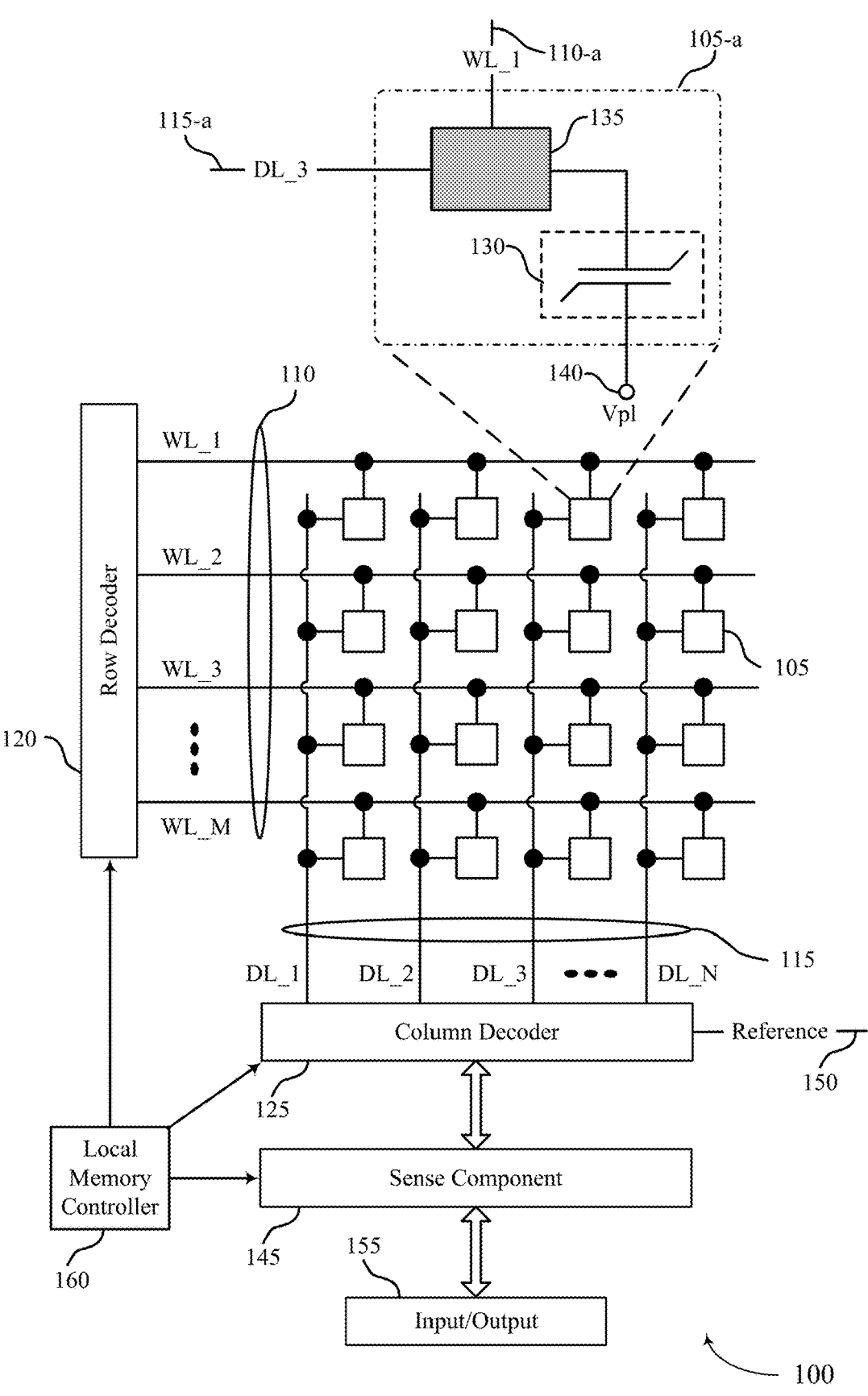
FIG. 1 illustrates an example of a memory die that supports a memory array with multiplexed digit lines in accordance with examples as disclosed herein.

FIG. 1 illustrates an example of a memory die 100 that supports a memory array with multiplexed digit lines in accordance with examples as disclosed herein. In some cases, the memory die 100 may be referred to as a memory chip, a memory device, or an electronic memory apparatus. The memory die 100 may include one or more memory cells 105 that are programmable to store different logic states. Each memory cell 105 may be programmable to store two or more states. For example, the memory cell 105 may be configured to store one bit of digital logic at a time (e.g., a logic 0 and a logic 1). In some cases, a single memory cell 105 (e.g., a multi-level memory cell) may be configured to store more than one bit of digit logic at a time (e.g., a logic 00, logic 01, logic 10, or a logic 11).

A memory cell 105 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. In some cases, such a capacitor may be alternatively referred to as a container (or a cell container).

Operations such as reading and writing may be performed on memory cells 105 by activating or selecting access lines such as a word line 110 and/or a digit line 115. In some cases, digit lines 115 may also be referred to as bit lines. References to access lines, word lines and digit lines, or their analogues, are interchangeable without loss of understanding or operation. Activating, selecting, biasing a word line 110 or a digit line 115 may include applying a voltage to the respective line.

The memory die 100 may include the access lines (e.g., the word lines 110 and the digit lines 115) arranged in a grid-like pattern. Memory cells 105 may be positioned at intersections of the word lines 110 and the digit lines 115. By biasing a word line 110 and a digit line 115 (e.g., applying a voltage to the word line 110 or the digit line 115), a single memory cell 105 may be accessed at their intersection.

Accessing the memory cells 105 may be controlled through a row decoder 120 or a column decoder 125. For example, a row decoder 120 may receive a row address from a local memory controller 160 and activate a word line 110 based on the received row address. A column decoder 125 may receive a column address from the local memory controller 160 and may activate a digit line 115 based on the received column address. For example, the memory die 100 may include multiple word lines 110, labeled WL_1 through WL_M, and multiple digit lines 115, labeled DL_1 through DL_N, where M and N depend on the size of the memory array. Thus, by activating a word line 110 and a digit line 115, e.g., WL_1 and DL_3, the memory cell 105 at their intersection may be accessed. The intersection of a word line 110 and a digit line 115, in either a two-dimensional or three-dimensional configuration, may be referred to as an address of a memory cell 105.

The memory cell 105 may include a storage component 130 (e.g., a capacitor, a container) and a selection component 135 (which may be referred to as a switching component). The selection component 135 may include one or more transistors (e.g., two transistors connected in a series configuration) or any other type of switch devices that selectively establishes or de-establishes electronic communication between two components. A first node of the storage component 130 may be coupled with the selection component 135 and a second node of the storage component 130 may be coupled with a voltage source 140. In some cases, the voltage source 140 may be the cell plate reference voltage, such as Vpl, or may be ground, such as Vss. In some cases, the voltage source 140 may be an example of a plate line coupled with a plate line driver. The selection component 135 may be further coupled with a select line that is omitted in FIG. 1 to improve clarity of illustrating the components. In such cases, the select line may be configured to selectively couple the memory cell 105 with the digit line 115. Examples of configurations for the selection component 135 are described with reference to FIGS. 2, 3, 4A, and 4B.

Selecting or deselecting the memory cells 105 may be accomplished by activating or deactivating the selection component 135. In other words, the storage component 130 may be in electronic communication with the digit line 115 using the selection component 135. For example, the storage component 130 may be isolated from digit line 115 when the selection component 135 is deactivated and the storage component 130 may be coupled with digit line 115 when the selection component 135 is activated. In some cases, the selection component 135 include at least a transistor and its operation may be controlled by applying a voltage to the transistor gate, where the voltage differential between the transistor gate and transistor source may be greater or less than a threshold voltage of the transistor. In some cases, the selection component 135 may include a p-type transistor or an n-type transistor. In some cases, the selection component 135 may include at least a vertical transistor. The word line 110 may be in electronic communication with the gate of the selection component 135 and may activate/deactivate the selection component 135 based on a voltage being applied to word line 110.

In some cases, the selection component 135 of memory cell 105 may include two transistors (e.g., a first transistor and a second transistor). In such cases, selecting the memory cell 105 may include biasing the word line 110 coupled with the first transistor of the selection component 135. Biasing the word line 110 may also select additional memory cells 105 coupled with the biased word line 110. Further, coupling the selected memory cell 105 with the digit line 115 may include biasing the select line coupled with the second transistor of selection component 135. In this manner, selecting the memory cell 105 and coupling the selected memory cell 105 may include activating the first transistor and the second transistor of the selection component 135. In other words, additional memory cell 105 that has been selected by the biased word line 110 (e.g., the first transistor of the selection component 135 is activated) may remain decoupled with their respective digit lines 115 (e.g., the second transistor of the selection component 135 is deactivated).

A word line 110 may be a conductive line in electronic communication with a memory cell 105 that is used to perform access operations on the memory cell 105. In some architectures, the word line 110 may be in electronic communication with a gate of a selection component 135 (e.g., a gate of the first transistor) of a memory cell 105 and may be configured to control the selection component 135 of the memory cell 105. In some architectures, the word line 110 may be in electronic communication with a node of the capacitor of the memory cell 105 and the memory cell 105 may not include a selection component.

A digit line 115 may be a conductive line that connects the memory cell 105 with a sense component 145. In some architectures, the memory cell 105 may be selectively coupled with the digit line 115 during portions of an access operation. For example, the word line 110 and the selection component 135 of the memory cell 105 may be configured to couple and/or isolate the capacitor of the memory cell 105 and the digit line 115. In some architectures, the memory cell 105 may be in electronic communication (e.g., constant) with the digit line 115.

The sense component 145 may be configured to detect a state (e.g., a charge) stored on the logic storage component (e.g., capacitor) of the memory cell 105 and determine a logic state of the memory cell 105 based on the stored state. The charge stored by a memory cell 105 may be extremely small, in some cases. As such, the sense component 145 may include one or more sense amplifiers to amplify the signal output by the memory cell 105. The sense amplifiers may detect small changes in the charge of a digit line 115 during a read operation and may produce signals corresponding to a logic state 0 or a logic state 1 based on the detected charge. During a read operation, the capacitor of memory cell 105 may output a signal (e.g., discharge a charge) to its corresponding digit line 115. The signal may cause a voltage of the digit line 115 to change. The sense component 145 may be configured to compare the signal received from the memory cell 105 across the digit line 115 to a reference signal 150 (e.g., reference voltage). The sense component 145 may determine the stored state of the memory cell 105 based on the comparison.

For example, in binary-signaling, if digit line 115 has a higher voltage than the reference signal 150, the sense component 145 may determine that the stored state of memory cell 105 is a logic 1 and, if the digit line 115 has a lower voltage than the reference signal 150, the sense component 145 may determine that the stored state of the memory cell 105 is a logic 0. The sense component 145 may include various transistors or amplifiers to detect and amplify a difference in the signals. In some cases, the sense component 145 may be part of another component (e.g., a column decoder 125, row decoder 120). In some cases, the sense component 145 may be in electronic communication with the row decoder 120 or the column decoder 125. In some cases, the sense component 145 may be configured to selectively couple with a set of digit lines 115 during a read operation.

The local memory controller 160 may control the operation of memory cells 105 through the various components (e.g., row decoder 120, column decoder 125, and sense component 145). In some cases, one or more of the row decoder 120, column decoder 125, and sense component 145 may be co-located with the local memory controller 160. The local memory controller 160 may be configured to receive commands and/or data from an external memory controller, translate the commands and/or data into information that can be used by the memory die 100, perform one or more operations on the memory die 100, and communicate data from the memory die 100 to the external memory controller in response to performing the one or more operations. The local memory controller 160 may generate row and column address signals to activate the target word line 110 and the target digit line 115. The local memory controller 160 may also generate and control various voltages or currents used during the operation of the memory die 100. In general, the amplitude, shape, or duration of an applied voltage or current discussed herein may be adjusted or varied and may be different for the various operations discussed in operating the memory die 100.

In some cases, the local memory controller 160 may be configured to perform a write operation (e.g., a programming operation) on one or more memory cells 105 of the memory die 100. During a write operation, a memory cell 105 of the memory die 100 may be programmed to store a desired logic state. In some cases, a plurality of memory cells 105 may be programmed during a single write operation. The local memory controller 160 may identify a target memory cell 105 on which to perform the write operation. The local memory controller 160 may identify a target word line 110 and a target digit line 115 in electronic communication with the target memory cell 105 (e.g., the address of the target memory cell 105). The local memory controller 160 may activate the target word line 110 and the target digit line 115 (e.g., applying a voltage to the word line 110 or digit line 115), to access the target memory cell 105. The local memory controller 160 may apply a specific signal (e.g., voltage) to the digit line 115 during the write operation to store a specific state (e.g., charge) in the storage component 130 of the memory cell 105, the specific state (e.g., charge) may be indicative of a desired logic state.

In some cases, the local memory controller 160 may be configured to perform a read operation (e.g., a sense operation) on one or more memory cells 105 of the memory die 100. During a read operation, the logic state stored in a memory cell 105 of the memory die 100 may be determined. In some cases, a plurality of memory cells 105 may be sensed during a single read operation. The local memory controller 160 may identify a target memory cell 105 on which to perform the read operation. The local memory controller 160 may identify a target word line 110 and a target digit line 115 in electronic communication with the target memory cell 105 (e.g., the address of the target memory cell 105). The local memory controller 160 may activate the target word line 110 and the target digit line 115 (e.g., applying a voltage to the word line 110 or digit line 115), to access the target memory cell 105. The target memory cell 105 may transfer a signal to the sense component 145 in response to biasing the access lines. The sense component 145 may amplify the signal. The local memory controller 160 may fire the sense component 145 (e.g., latch the sense component) and thereby compare the signal received from the memory cell 105 to the reference signal 150. Based on that comparison, the sense component 145 may determine a logic state that is stored on the memory cell 105. The local memory controller 160 may communicate the logic state stored on the memory cell 105 to the external memory controller as part of the read operation.

Figure 2:
FIG. 2 illustrates an example of a circuit diagram that supports a memory array with multiplexed digit lines in accordance with examples as disclosed herein.

FIG. 2 illustrates an example of a circuit diagram 200 that supports a memory array with multiplexed digit lines in accordance with examples as disclosed herein. The circuit diagram 200 illustrates an example of a configuration of memory cell that includes a selection component with two transistors and a configuration of a multiplexer associated with the digit lines. The circuit diagram 200 may include memory cells 205 (which may be examples of memory cells 105 described with reference to FIG. 1), word lines 210 (which may be examples of word lines 110 described with reference to FIG. 1), digit lines 215 (which may be examples of digit lines 115 described with reference to FIG. 1), sense components 245 (which may be examples of sense components 145 described with reference to FIG. 1), select lines 260, plate lines 265, and digit line multiplexing component 270. The circuit diagram 200 may illustrate a memory array including eight (8) memory cells 205 coupled with two (2) word lines 210 and four (4) digit lines 215. The circuit diagram 200 may be considered as illustrating two (2) sub-arrays that each include four (4) memory cells 205 coupled with two (2) word lines and two (2) digit lines. Further, each sub-array of four memory cells 205 is coupled with the sense component 245.

The memory cell 205 may include a storage component 206 (which may be an example of the storage component 130 described with reference to FIG. 1) configured to store a logic state of the memory cell 205. In some cases, a node of storage component 206 may be coupled with the plate lines 265 as depicted in the circuit diagram 200. In some cases, the plate lines 265 may be biased to a constant voltage (e.g., plate voltage) during a portion of read operation. In some cases, the memory cell 205 may include a selection component (e.g., the selection component 135 described with reference to FIG. 1) including more than one transistor—e.g., a first transistor 207 and a second transistor 208 connected in a serious configuration. The first transistor 207 may be further coupled with the storage component 206 and the word line 210. The second transistor 208 may be further coupled with the digit line 215 and the select line 260.

The storage component 206 may be coupled with the digit line 215 when both transistors are activated—e.g., the first transistor 207 activated by the word line 210 and the second transistor 208 activated by the select line 260. The locations of the first transistor 207 and the second transistor 208 may be interchangeable. A biased word line 210 may activate or select all memory cells 205 coupled with the biased word line 210 (e.g., memory cells 205-a through memory cells 205-d when the word line 210-a is biased to activate the first transistors 207 coupled with the biased word line 210-a), and the second transistors 208 may provide an additional degree of freedom as to a particular memory cell 205 may be coupled with a respective digit line 215 (e.g., a selected digit line 215). For example, one of the selected memory cells (e.g., memory cell 205-a) may be coupled with a respective digit line (e.g., digit line 215-a) by biasing one of the select lines (e.g., select line 260-a) while other selected memory cells (e.g., memory cell 205-b) may remain decoupled from the digit lines 215. Similarly, the selected memory cell 205-c may be coupled with the digit line 215-c by biasing the select line 260-c while the selected memory cell 205-d may remain decoupled from the digit line 215-d by debiasing the select line 260-d.

The additional degree of freedom provided by the second transistors 208 may facilitate sharing the sense component 245 with more than one digit line 215. For example, the sense component 245-a may be shared by digit line 215-a and digit line 215-b. The digit line multiplexing component 270 may include a set of transistors that each may be coupled with a respective digit line. For example, the digit line multiplexing component 270-a depicted in the circuit diagram 200 may include a first multiplexing transistor 271-a coupled with the digit line 215-a and a second multiplexing transistor 271-b coupled with the digit line 215-b. Further, each multiplexing transistor may be coupled with respective select line 260. As such, the second transistor 208 of the memory cell 205 and the multiplexing transistor 271 may be coupled with a common select line 260 and a particular memory cell 205 may be coupled with a respective digit line that may be further coupled with the sense component 245 at a time. In this manner, more than one digit lines 215 may be multiplexed with the single sense component 245 at any given time during a read operation—e.g., the sense component 245 coupled with multiplexed digit lines 215.

Memory cells 205 that include more than one transistor—the first transistor 207 activated by the word line 210 and the second transistor 208 activated by the select line 260—may also utilize different timings for access operations. In some examples, the first transistor 207 may be activated by biasing the word line 210 before the second transistor 208 is activated by biasing the select line 260. In some other examples, the second transistor 208 may be activated by biasing the select line 260 before the first transistor 207 is activated by biasing the word line 210. In yet other examples, the first transistor 207 and the second transistor 208 may be activated at the same time or near the same time. In such examples, the word line 210 and the select line 260 may be biased at the same time or near the same time. In examples where the select line 260 is biased before the word line 210, the sense component 245 may be coupled with the digit line 215 before the memory cell 205 is coupled with the digit line 215.

Further, the additional degree of freedom provided by the second transistor 208 of the memory cell 205 may alleviate some issues related to reducing spaces between digit lines 215 (e.g., digit lines having a reduced pitch) in an effort to decrease an area occupied by a memory array. In some cases, a tight digit line pitch may result in significant read disturbs. In the context of memory device including a memory array, read disturbs may refer to adverse effects on logic states stored in memory cells that are coupled with unselected digit lines when a digit line (e.g., a digit line next to the unselected digit lines) is activated (e.g. coupled with a memory cell 105 to read a logic state stored in the memory cell 105 using a sense component). In some cases, the activated digit line may be referred to as an aggressor and the unselected digit lines next to the activated digit line may be referred to as victims. In such cases, the second transistor 208 may couple a memory cell 205 with a selected digit line 215 (e.g., aggressor) while other second transistors 208 may maintain other memory cells 205 decoupled with the unselected digit lines 215 (e.g., victims). Although part of voltage changes associated with the aggressor digit line may be coupled (e.g., through capacitive coupling) to the victim digit line(s), the logic states stored in the other memory cells 205 may be protected from such voltage changes. In some cases, the victim digit lines may be coupled with a constant voltage (e.g., a plate voltage). In other cases, the victim digit lines may be configured to float. In this manner, read disturbs may be mitigated by the memory cell 205 that includes two transistors.

In some cases, the sense component 245 coupled with multiplexed digit lines 215 as described herein may provide a greater area for designing the sense component 245—e.g., when compared to an area to incorporate multiple sense components that each may be dedicated to a single digit line. In some cases, sharing a sense component 245 among a set of digit lines 215 may reduce overall circuit area occupied by the sense component 245. Such area reduction may facilitate adding different functional circuits (e.g., sub-word line drivers) in the substrate that supports a memory array including the memory cells 205. In some cases, having a greater area for designing the sense component 245 may facilitate building a more sophisticated functionality into the sense component 245—e.g., full-charge extraction function, threshold voltage compensation function. In some cases, the sense component 245 having multiplexed digit lines 215 may facilitate leveraging cross-learnings among different memory technologies (e.g., FeRAM, DRAM, 3D XPoint™ memory) that may utilize such sense component having multiplexed digit lines.

In some cases, a memory device may include a memory cell coupled with a digit line and a plate line, where the memory cell includes a storage component and two transistors connected in a series configuration. The memory device may further include a word line coupled with a gate of a first transistor of the two transistors and configured to select the memory cell, and a select line coupled with a gate of a second transistor of the two transistors and configured to couple the memory cell with the digit line. The memory device may include a sense component configured to selectively couple with a plurality of digit lines including the digit line, and a third transistor coupled with the select line and configured to selectively couple the digit line with the sense component during at least a portion of a read operation.

In some cases, a first node of at least one of the two transistors is coupled with the storage component and a second node of another of the two transistors is coupled with the digit line. In some cases, the first transistor is coupled with the storage component at the first node and the second transistor is coupled with the digit line at the second node. In some cases, the first transistor is coupled with the digit line at the second node and the second transistor is coupled with the storage component at the first node. In some cases, the memory device may further include a second memory cell coupled with the word line and a second digit line of the plurality, and a fourth transistor configured to selectively couple the second digit line of the plurality with the sense component, a gate of the fourth transistor coupled with a second select line. In some cases, the storage component may be coupled with the plate line. In some cases, the memory cell includes a dynamic random access memory (DRAM) cell.

In some cases, a memory device may include a memory cell, a word line coupled with the memory cell, a digit line coupled with the memory cell and extending in a first direction, a select line coupled with the memory cell and extending in the first direction, the select line configured to selectively couple the memory cell with the digit line, a sense component configured to be selectively coupled with a plurality of digit lines that include the digit line, and a first transistor configured to selectively couple the digit line with the sense component, a gate of the first transistor coupled with the select line.

In some cases, the memory device may further include a second memory cell coupled with the word line and a second digit line of the plurality, and a second transistor configured to selectively couple the second digit line of the plurality with the sense component, a gate of the second transistor coupled with a second select line. In some cases, the word line extends in a second direction orthogonal to the first direction. In some cases, the first direction and the second direction are parallel to a surface of a substrate.

Figure 3:
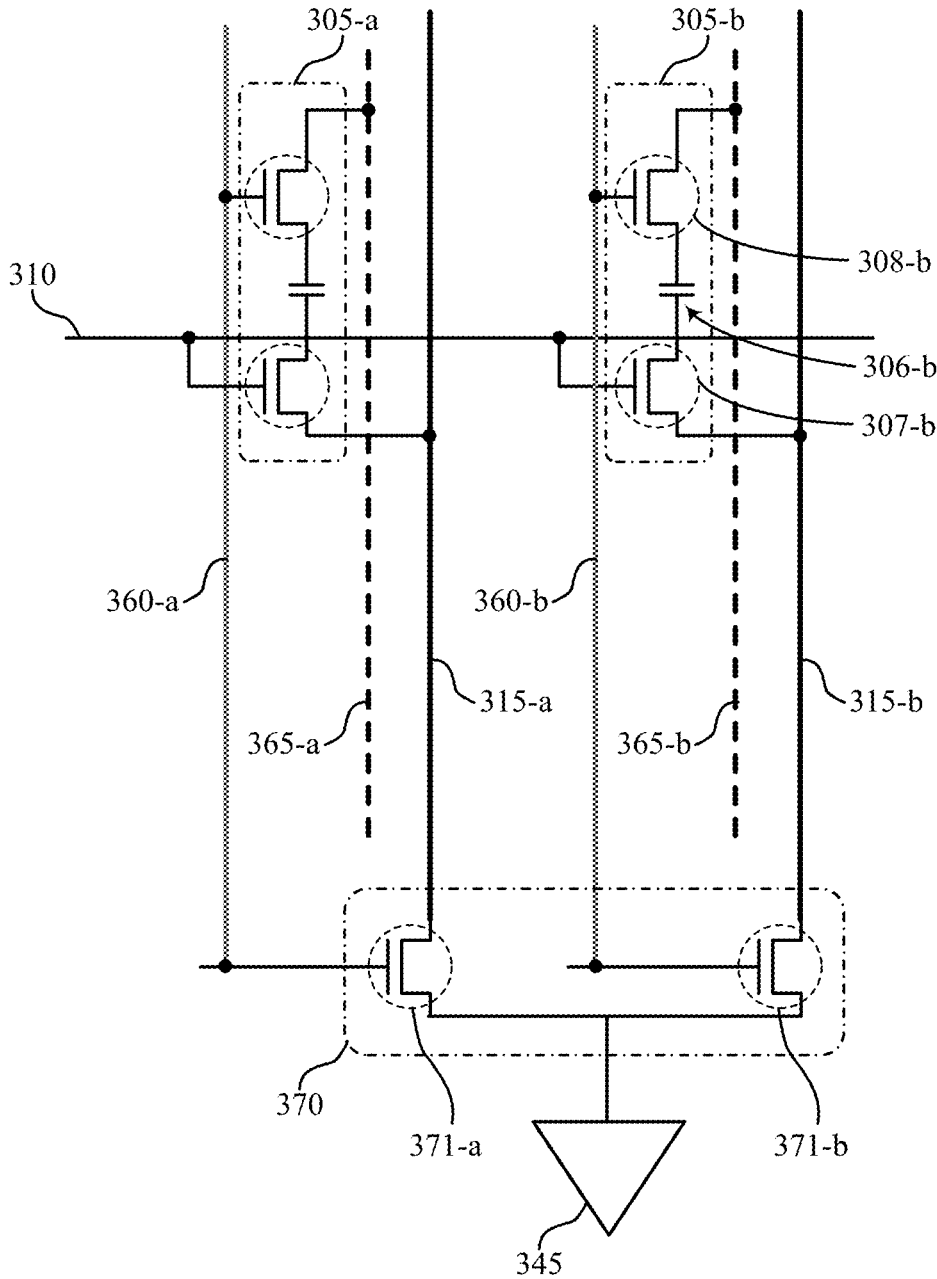
FIG. 3 illustrates an example of a circuit diagram that supports a memory array with multiplexed digit lines in accordance with examples as disclosed herein.

FIG. 3 illustrates an example of a circuit diagram 300 that supports a memory array with multiplexed digit lines in accordance with examples as disclosed herein. The circuit diagram 300 illustrates an example of a configuration of memory cell that includes a selection component with two transistors and a configuration of a multiplexer associated with the digit lines. The circuit diagram 300 includes memory cells 305 (which may be examples of memory cells 105 or memory cells 205 described with reference to FIGS. 1 and 2), a word line 310 (which may be an example of word lines 110 or word lines 210 described with reference to FIGS. 1 and 2), digit lines 315 (which may be examples of digit lines 115 or digit lines 215 described with reference to FIGS. 1 and 2), a sense component 345 (which may be an example of sense component 145 or sense components 245 described with reference to FIGS. 1 and 2), select lines 360 (which may be examples of select lines 260 described with reference to FIG. 2), plate lines 365 (which may be examples of plate lines 265 described with reference to FIG. 2), and a digit line multiplexing component 370 (which may be an example of digit line multiplexing components 270 described with reference to FIG. 2).

The memory cell 305 may be an alternative embodiment of the memory cell 205 described with reference to FIG. 2. For example, the transistors 307 and 308 may each be coupled with the storage element 306. The memory cell 305 may include a storage component 306 (which may be an example of storage component 206 described with reference to FIG. 2) coupled with a first transistor 307 (which may be an example of the first transistor 207 described with reference to FIG. 2) and a second transistor 308 (which may be an example of the second transistor 208 described with reference to FIG. 2). The first transistor 307 may be coupled with the word line 310 (e.g., a gate of first transistor 307-$b$ coupled with word line 310) and the digit line 315. The second transistor 308 may be coupled with the select line 360 (e.g., a gate of second transistor 308-$b$ coupled with select line 360-$b$) and the plate line 365. The plate line 365 may be interchangeable with the digit line 315 without loss of understanding or operation of the memory cell 305 as depicted in the circuit diagram 300.

The circuit diagram 300 may include portions of the circuit diagram 200 described with reference to FIG. 2. For example, the storage component 306 of the memory cell 305 may be connected between the plate line 365 and the digit line 215 to determine a logic state stored in the storage component 306 when the first transistor 307 and the second transistor 308 are both activated during a read operation. In other words, the memory cells 305 may be activated (e.g., a word line 310 is biased to activate the first transistors 307 associated with the word line 310) and coupled with the respective digit lines 315.

In addition, the second transistor 308 may be activated (e.g., a select line 360 is biased to activate the second transistor 308) to couple the storage component 306 with the plate line 365 to complete a current path between the plate line 365 and the digit line 315. As described herein, the select lines 360 in conjunction with the second transistor 308 may provide the additional degree of freedom to selectively couple one of activated memory cells 305 (e.g., memory cell 305-$a$ and memory cell 305-$b$ coupled with the word line 310) with the respective digit line 315 (e.g., memory cell 305-$a$ with digit line 315-$a$, memory cell 305-$a$ with digit line 315-$a$). In some examples, the second transistor 308 may be activated by biasing the select line 360 before the first transistor 307 is activated by biasing the word line 310.

In addition, a multiplexing transistor 371 (which may be examples of the multiplexing transistors 271 described with reference to FIG. 2) of the digit line multiplexing component 370 may be activated by biasing the select line 360 so as to couple one of the digit lines 315 with the sense component 345 that may be configured to selectively couple with a set of digit lines. In examples where the select line 360 is biased before the word line 310, the sense component 345 may be coupled with the digit line 315 before the memory cell 305 is coupled with the digit line 315.

In some cases, a memory device may include a memory cell coupled with a digit line and a plate line, where the memory cell includes a storage component, a first transistor coupled with the storage component and the digit line, and a second transistor coupled with the storage component and the plate line. The memory device may include a word line coupled with a gate of the first transistor and configured to selectively couple the storage component with the digit line, and a select line coupled with a gate of the second transistor and configured to selectively couple the storage component with the plate line. The memory device may further include a sense component configured to selectively couple with a plurality of digit lines including the digit line, and a third transistor coupled with the select line and configured to selectively couple the digit line with the sense component during at least a portion of a read operation.

In some cases, the memory device may further include a second memory cell coupled with the word line and a second digit line of the plurality, and a fourth transistor configured to selectively couple the second digit line of the plurality with the sense component, where a gate of the fourth transistor is coupled with a second select line.

Figure 4A:
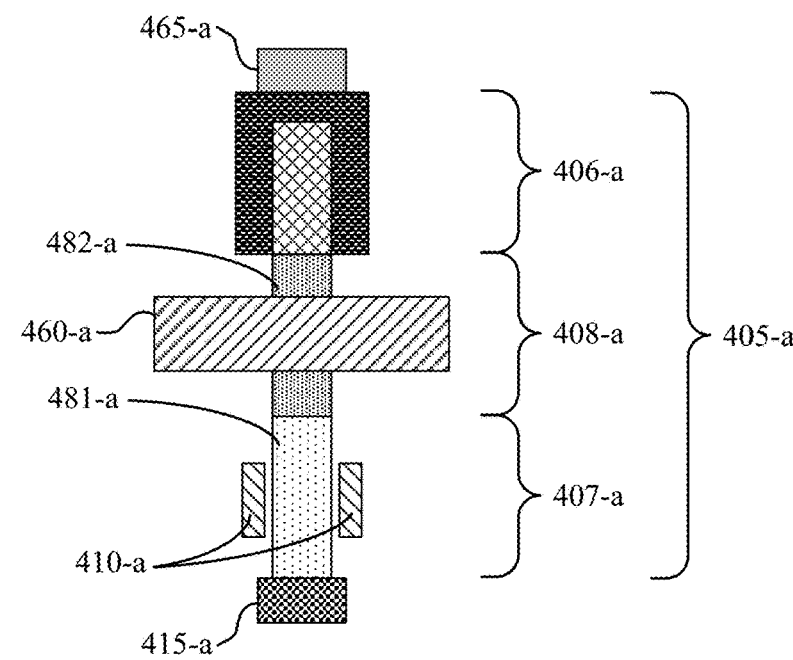
FIGS. 4A and 4B illustrate examples of cross-sectional side views of a portion of a memory array with multiplexed digit lines in accordance with examples as disclosed herein.
Figure 4A:
Figure 4B:
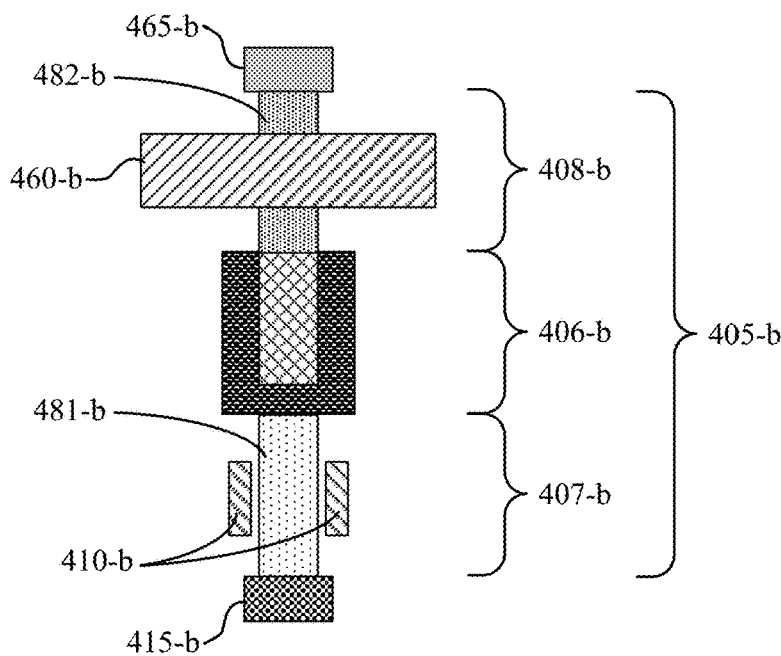
Figure 4B:
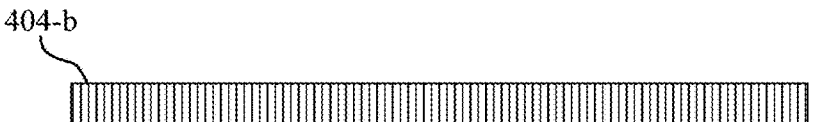

FIGS. 4A and 4B illustrate examples of cross-sectional side views 401 and 402 of a portion of a memory array with multiplexed digit lines in accordance with examples as disclosed herein. The cross-sectional side views 401 and 402 illustrate that transistors 407 and 408 may be examples of vertical transistors. In some cases, the memory array may be located above a substrate. The cross-sectional side view 401 (or the cross-sectional side view 402) depicts a substrate 404, a word line 410 (which may be an example of word lines 210 or word lines 310 described with reference to FIGS. 2 and 3), a digit line 415 (which may be an example of digit lines 215 or digit lines 315 described with reference to FIGS. 2 and 3), a plate line 465 (which may be an example of plate lines 265 or plate lines 365 described with reference to FIGS. 2 and 3), and a select line 460 (which may be an example of select lines 260 or select lines 360 described with reference to FIGS. 2 and 3). Further, the cross-sectional side view 401 (or the cross-sectional side view 402) depicts a memory cell 405 (which may be an example of memory cell 205 or memory cell 305 described with reference to FIGS. 2 and 3) that includes a storage component 406 (which may be an example of the storage component 206 or the storage component 306 described with reference to FIGS. 2 and 3), a first vertical transistor 407 (which may be an example of the first transistor 207 or the first transistor 307 described with reference to FIGS. 2 and 3), and a second vertical transistor 408 (which may be an example of the second transistor 208 or the second transistor 308 described with reference to FIGS. 2 and 3).

The first vertical transistor 407 may include a first gate coupled with the word line 410 and a first doped region 481 extending in a first direction away from a surface of the substrate 404. Further, the second vertical transistor 408 may include a second gate coupled with the select line 460 and a second doped region 482 extending in the first direction away from the surface of the substrate 404. In some cases, the first direction may be orthogonal to the surface of the substrate 404.

In some cases, the word line 410 may extend in a second direction parallel to a plane defined by the surface of the substrate 404. In some cases, the select line 460 may extend in a third direction parallel to the plane defined by the surface of the substrate 404, where the third direction may be orthogonal to the second direction. In some cases, the select line 460 may be configured to couple the digit line 415 associated with the memory cell 405 with a sense component configured to selectively couple with a set of digit lines including the digit line 415 during a read operation.

In some cases, the first doped region 481 may be a first distance away from the surface of the substrate 404 and the second doped region 482 may be a second distance away from the surface of the substrate 404 different than the first distance. In some cases, the word line 410 may be a first distance away from the surface of the substrate 404 and the select line 460 may be a second distance away from the surface of the substrate 404 different than the first distance.

FIG. 4A illustrates the cross-sectional side view 401 of memory cell 405-a that may be an example of the memory cell 205 described with reference to FIG. 2. The memory cell 405-a may correspond to the memory cell 205 described with reference to FIG. 2 except that the location of first transistor 207 is interchanged with the location of second transistor 208—e.g., the second vertical transistor 408 is coupled with the storage component 406 in the memory cell 405-a. The cross-sectional side view 401 illustrates that a first node of storage component 406-a is coupled with the plate line 465-a and a second node of storage component 406-a is coupled with a first node of the second vertical transistor 408-a. Further, a second node of the second vertical transistor 408-a is further coupled with a second node of the first vertical transistor 407-a.

Moreover, a first node of the first vertical transistor 407-a is coupled with the digit line 415-a. In some cases, a first node of the first vertical transistor 407-a may be coupled with a first node of the storage component 406-a and a first node of the second vertical transistor 408-a may be coupled with the digit line 415-a—e.g., locations of the first vertical transistor 407-a and the second vertical transistor 408-a may be interchanged.

Still referring to FIG. 4A, the storage component 406-a may be a third distance away from the surface of the substrate 404 and the third distance may be greater than the first distance (e.g., the distance between the first doped region 481 and the surface of the substrate 404) or the second distance (e.g., the distance between the second doped region 482 and the surface of the substrate 404).

In some cases, such a configuration depicted in FIG. 4A may facilitate forming the first vertical transistor 407 and the second vertical transistor 408 without considering a thermal budget restriction associated with the storage component 406. For example, an anneal temperature that exceeds the thermal budget may be used to activate dopant atoms within the first doped region 481 (or the second doped region 482) because the storage component 406-a may not yet be formed.

FIG. 4B illustrates the cross-sectional side view 402 of memory cell 405-b that may be an example of the memory cell 305 described with reference to FIG. 3. The cross-sectional side view 402 illustrates that a first node of the first vertical transistor 407-b may be coupled with a first node of the storage component 406-b and a first node of the second vertical transistor 408-b may be coupled with a second node of the storage component 406-b.

Further, a second node of the first vertical transistor 407-b may be coupled with the digit line 415-b and a second node of the second vertical transistor 408-b may be coupled with the plate line 465-b. The cross-sectional side view 402 of memory cell 405-b illustrates that the storage component 406-b may have been formed when the second vertical transistor 408-b is formed. As such, process conditions to form the second vertical transistor 408-b may be restricted so as not to exceed the thermal budget associated with the storage component 406, in some cases.

Figure 5:
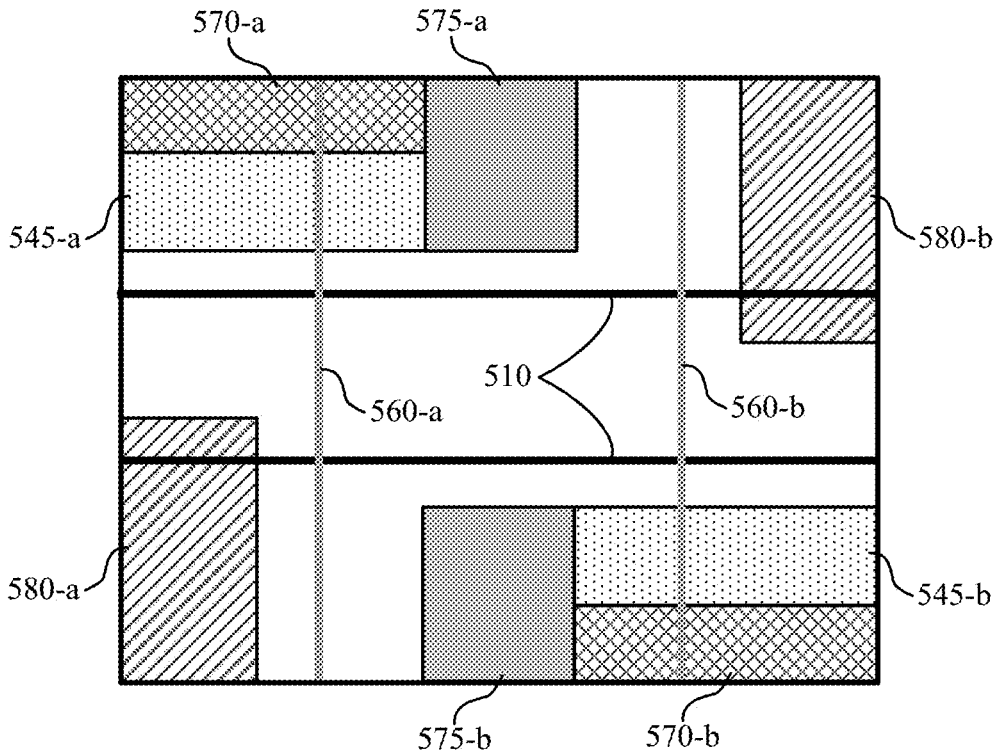
FIG. 5 illustrates an example of a memory tile configuration that supports a memory array with multiplexed digit lines in accordance with examples as disclosed herein.

FIG. 5 illustrates an example of a memory tile configuration 500 that supports a memory array with multiplexed digit lines in accordance with examples as disclosed herein. The memory tile configuration 500 illustrates only a portion of components in a substrate (e.g., substrate 404 described with reference to FIG. 4) of a memory tile for clarity purposes. The memory tile configuration 500 may include sense components 545 (which may be examples of the sense component 245 or the sense component 345 described with reference to FIGS. 2 and 3), digit line multiplexing components 570 (which may be examples of the digit line multiplexing component 270 or the digit line multiplexing component 370 described with reference to FIGS. 2 and 3), digit line multiplexing component drivers 575, and sub-word line drivers (SWD) 580. In some cases, a memory array including memory cells (e.g., memory cells 405 described with reference to FIG. 4) may be located above the substrate and the memory array may include a set of word lines 510 and a set of select lines 560. Further, the memory array may include a set of digit lines (e.g., digit lines 415 described with reference to FIG. 4) and a set of plate lines (e.g., plate lines 465 described with reference to FIG. 4).

The sense component 545 may be configured to selectively couple with the set of digit lines during at least a portion of a read operation. The digit line multiplexing component 570 may be coupled with select lines 560 and configured to selectively couple a digit line of the set with the sense component 545 based on the select lines 560—e.g., activated select line 360-*a* may activate a multiplexing transistor 371-*a* such that digit line 315-*a* may be coupled with the sense component 345 at any given time during the read operation. In some cases, the sub-word line drivers 570-*a* and 570-*b* may be placed under the array and drive the select lines 560. The select lines 560 may be coupled with the select devices of the memory array, including those above the circuit components. In some cases, the sense component 545 may include more than one sense components 545 (e.g., two sense components 245 described with reference to FIG. 2) and each sense component 545 may be configured to couple with a subset of the digit lines—e.g., sense component 245-*a* configured to couple with digit lines 215-*a* and 215-*b*, sense component 245-*b* configured to couple with digit lines 215-*c* and 215-*d*. In such cases, the digit line multiplexing component 570 may be configured to selectively couple a digit line of the subset with respected sense component—e.g., sense component 245-*a* coupled with digit lines 215-*a*, sense component 245-*b* coupled with digit lines 215-*c*.

The digit line multiplexing component drivers 575 may be coupled with the digit line multiplexing component 570 and configured to support the digit line multiplexing component drivers 575 during the read operation—e.g., providing a sufficient current to the digit line multiplexing component 570. Further, the sub-word line drivers 580 may be coupled with the set of word lines 510 and configured to access memory cells of the memory array. In some cases, the sub-word line drivers 580 may be placed under the array and drive the set of word lines 510. The set of word lines 510 may be coupled with the select devices of the memory array, including those above the circuit components.

In some cases, the sense component 545 configured to selectively couple with the set of digit lines (e.g., multiplexed digit lines) may occupy a less area of the substrate when compared to other sense component configurations (e.g., one sense component per digit line) to facilitate enhancing functionality of existing components (e.g., by providing a greater area to the existing component) or adding additional components (e.g., sub-word line driver) that otherwise may not have an adequate area of the substrate.

Figure 6:
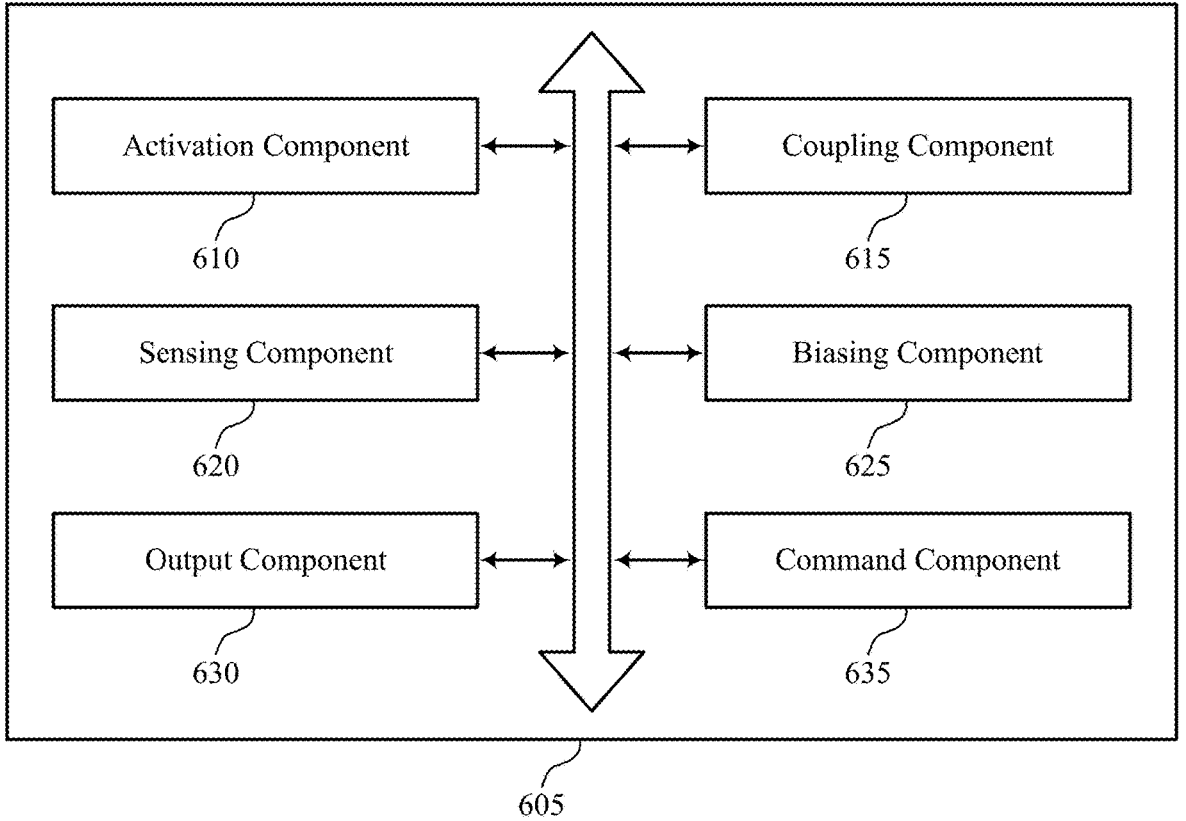
FIG. 6 shows a block diagram of a memory controller that supports a memory array with multiplexed digit lines in accordance with examples as disclosed herein.

FIG. 6 shows a block diagram 600 of a controller 605 that supports a memory array with multiplexed digit lines in accordance with examples as disclosed herein. The controller 605 may be an example of a local memory controller 160 as described with reference to FIG. 1. The controller 605 may include an activation component 610, a coupling component 615, a sensing component 620, a biasing component 625, an output component 630, and a command component 635. Each of these modules may communicate, directly or indirectly, with one another (e.g., via one or more buses).

The activation component 610 may activate a first transistor of a memory cell coupled with a word line. In some examples, the activation component 610 may activate a second transistor of the memory cell coupled with a select line.

The coupling component 615 may couple, by a third transistor coupled with the select line, a digit line with a sense component configured to selectively couple with a set of digit lines including the digit line. In some examples, the coupling component 615 may couple a second digit line of the set with a plate line, where coupling the digit line with the sense component is based on coupling the second digit line of the set with the plate line. In some examples, the coupling component 615 may decouple, by the third transistor, the digit line from the sense component based on receiving the second command. In some examples, the coupling component 615 may couple, by a fourth transistor coupled with a second select line, the second digit line of the set with the sense component, based on decoupling the digit line from the sense component.

The sensing component 620 may determine, by the sense component, a logic state stored in a storage component of the memory cell based on activating the first transistor, activating the second transistor, and coupling the digit line with the sense component.

The biasing component 625 may bias the select line to a voltage, where activating the second transistor of the memory cell and coupling the digit line with the sense component are based on biasing the select line to the voltage. In some examples, the biasing component 625 may cause a second digit line of the set to float, where coupling the digit line with the sense component is based on causing the second digit line of the set to float. The biasing component 625 may bias the word line to a second voltage, where activating the first transistor of the memory cell and coupling the digit line with the sense component are based at least in part on biasing the word line to the second voltage. In some examples, the select line is biased before the word line is biased. In some examples, the select line is biased at the same time or after the word line is biased.

The output component 630 may output the logic state stored in the storage component of the memory cell based on determining the logic state by the sense component. In some examples, the output component 630 may output a logic state stored in the second memory cell based on coupling the second digit line of the set with the sense component.

The command component 635 may receive a command including an instruction to perform a read operation on the memory cell, where activating the first transistor and the second transistor of the memory cell are based on receiving the command. In some examples, the command component 635 may receive a second command including an instruction to perform a second read operation on a second memory cell coupled with the sense component through a second digit line of the set.

FIG. 7 shows a flowchart illustrating a method or methods 700 that supports a memory array with multiplexed digit lines in accordance with examples as disclosed herein. The operations of method 700 may be implemented by a memory device or its components as described herein. For example, the operations of method 700 may be performed by the controller 605 as described with reference to FIG. 6. In some examples, a controller may execute a set of instructions to control the functional elements of the controller to perform the described functions. Additionally or alternatively, a controller may perform aspects of the described functions using special-purpose hardware.

At 705, the controller may activate a first transistor of a memory cell coupled with a word line. The operations of 705 may be performed according to the methods described herein. In some examples, aspects of the operations of 705 may be performed by an activation component as described with reference to FIG. 6.

At 710, the controller may activate a second transistor of the memory cell coupled with a select line. The operations of 710 may be performed according to the methods described herein. In some examples, aspects of the operations of 710 may be performed by an activation component as described with reference to FIG. 6.

At 715, the controller may couple, by a third transistor coupled with the select line, a digit line with a sense component configured to selectively couple with a set of digit lines including the digit line. The operations of 715 may be performed according to the methods described herein. In some examples, aspects of the operations of 715 may be performed by a coupling component as described with reference to FIG. 6.

At 720, the controller may determine, by the sense component, a logic state stored in a storage component of the memory cell based on activating the first transistor, activating the second transistor, and coupling the digit line with the sense component. The operations of 720 may be performed according to the methods described herein. In some examples, aspects of the operations of 720 may be performed by a sensing component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for activating a first transistor of a memory cell coupled with a word line, activating a second transistor of the memory cell coupled with a select line, coupling, by a third transistor coupled with the select line, a digit line with a sense component configured to selectively couple with a set of digit lines including the digit line, and determining, by the sense component, a logic state stored in a storage component of the memory cell based on activating the first transistor, activating the second transistor, and coupling the digit line with the sense component.

Some examples of the method 700 and the apparatus described herein may further include operations, features, means, or instructions for biasing the select line to a voltage, where activating the second transistor of the memory cell and coupling the digit line with the sense component may be based on biasing the select line to the voltage. Some examples of the method 700 and the apparatus described herein may further include operations, features, means, or instructions for biasing the word line to a second voltage, where activating the first transistor of the memory cell and coupling the digit line with the sense component are based at least in part on biasing the word line to the second voltage. In some examples of the method 700, the select line is biased before the word line is biased. In some examples of the method 700, the select line is biased at the same time or after the word line is biased.

Some examples of the method 700 and the apparatus described herein may further include operations, features, means, or instructions for coupling a second digit line of the set with a plate line, where coupling the digit line with the sense component may be based on coupling the second digit line of the set with the plate line.

Some examples of the method 700 and the apparatus described herein may further include operations, features, means, or instructions for causing a second digit line of the set to float, where coupling the digit line with the sense component may be based on causing the second digit line of the set to float.

Some examples of the method 700 and the apparatus described herein may further include operations, features, means, or instructions for outputting the logic state stored in the storage component of the memory cell based on determining the logic state by the sense component.

Some examples of the method 700 and the apparatus described herein may further include operations, features, means, or instructions for receiving a command including an instruction to perform a read operation on the memory cell, where activating the first transistor and the second transistor of the memory cell may be based on receiving the command.

Some examples of the method 700 and the apparatus described herein may further include operations, features, means, or instructions for receiving a second command including an instruction to perform a second read operation on a second memory cell coupled with the sense component through a second digit line of the set, decoupling, by the third transistor, the digit line from the sense component based on receiving the second command, and coupling, by a fourth transistor coupled with a second select line, the second digit line of the set with the sense component, based on decoupling the digit line from the sense component.

Some examples of the method 700 and the apparatus described herein may further include operations, features, means, or instructions for outputting a logic state stored in the second memory cell based on coupling the second digit line of the set with the sense component.

FIG. 8 shows a flowchart illustrating a method or methods 800 that supports a memory array with multiplexed digit lines in accordance with examples as disclosed herein. The operations of method 800 may be implemented by a memory device or its components as described herein. For example, the operations of method 800 may be performed by a controller 605 as described with reference to FIG. 6. In some examples, a controller may execute a set of instructions to control the functional elements of the controller to perform the described functions. Additionally or alternatively, a controller may perform aspects of the described functions using special-purpose hardware.

At 805, the controller may activate a first transistor of a memory cell coupled with a word line. The operations of 805 may be performed according to the methods described herein. In some examples, aspects of the operations of 805 may be performed by an activation component as described with reference to FIG. 6.

At 810, the controller may bias the select line to a voltage. The operations of 810 may be performed according to the methods described herein. In some examples, aspects of the operations of 810 may be performed by a biasing component as described with reference to FIG. 6.

At 815, the controller may activate a second transistor of the memory cell coupled with a select line based on biasing the select line to the voltage. The operations of 815 may be performed according to the methods described herein. In some examples, aspects of the operations of 815 may be performed by an activation component as described with reference to FIG. 6.

At 820, the controller may couple, by a third transistor coupled with the select line and based on biasing the select line to the voltage, a digit line with a sense component configured to selectively couple with a set of digit lines including the digit line. The operations of 820 may be performed according to the methods described herein. In some examples, aspects of the operations of 820 may be performed by a coupling component as described with reference to FIG. 6.

At 825, the controller may determine, by the sense component, a logic state stored in a storage component of the memory cell based on activating the first transistor, activating the second transistor, and coupling the digit line with the sense component. The operations of 825 may be performed according to the methods described herein. In some examples, aspects of the operations of 825 may be performed by a sensing component as described with reference to FIG. 6.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A selection component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disc and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
a memory cell coupled with a digit line and a plate line, the memory cell comprising a storage component, a first transistor coupled with the storage component and the digit line, and a second transistor coupled with the storage component and the plate line;
a word line coupled with a gate of the first transistor and configured to selectively couple the storage component with the digit line;
a select line coupled with a gate of the second transistor and configured to selectively couple the storage component with the plate line;
a sense component configured to selectively couple with a plurality of digit lines comprising the digit line; and
a third transistor coupled with the select line and configured to selectively couple the digit line with the sense component during at least a portion of a read operation.

2. The memory device of claim 1, further comprising:
a second memory cell coupled with the word line and a second digit line of the plurality; and
a fourth transistor configured to selectively couple the second digit line of the plurality with the sense component, a gate of the fourth transistor coupled with a second select line.

3. The memory device of claim 1, wherein:
the first transistor is a first vertical transistor that comprises a first doped region that extends in a first direction between the storage component and the digit line; and the second transistor is a second vertical transistor that comprises a second doped region that extends in the first direction between the storage component and the plate line.

4. The memory device of claim 3, wherein:

the first doped region is positioned between the second doped region and a substrate of the memory device in the first direction.

5. The memory device of claim 4, wherein the storage component is positioned between the first doped region and the second doped region in the first direction.

6. A memory device, comprising:

a memory cell coupled with a digit line and a plate line, the memory cell comprising a storage component and two transistors connected in a series configuration;

a word line coupled with a gate of a first transistor of the two transistors and configured to select the memory cell;

a select line coupled with a gate of a second transistor of the two transistors and configured to couple the memory cell with the digit line;

a sense component configured to selectively couple with a plurality of digit lines comprising the digit line; and a third transistor coupled with the select line and configured to selectively couple the digit line with the sense component during at least a portion of a read operation.

7. The memory device of claim 6, wherein a first node of at least one of the two transistors is coupled with the storage component and a second node of another of the two transistors is coupled with the digit line.

8. The memory device of claim 7, wherein the first transistor is coupled with the storage component at the first node and the second transistor is coupled with the digit line at the second node.

9. The memory device of claim 7, wherein the first transistor is coupled with the digit line at the second node and the second transistor is coupled with the storage component at the first node.

10. The memory device of claim 6, further comprising:

a second memory cell coupled with the word line and a second digit line of the plurality; and a fourth transistor configured to selectively couple the second digit line of the plurality with the sense component, a gate of the fourth transistor coupled with a second select line.

11. The memory device of claim 6, wherein:

the first transistor is a first vertical transistor that comprises a first doped region that extends in a first direction between the storage component and the digit line; and the second transistor is a second vertical transistor that comprises a second doped region that extends in the first direction between the storage component and the plate line.

12. The memory device of claim 11, the first doped region is positioned between the second doped region and a substrate of the memory device in the first direction.

13. The memory device of claim 6, wherein the storage component is coupled with the plate line.

14. The memory device of claim 6, wherein the memory cell comprises a dynamic random access memory (DRAM) cell.

15. A memory device, comprising:

a memory cell comprising a storage component, a first transistor, and a second transistor, wherein the first transistor and the second transistor are coupled with the storage component;

a word line coupled with the memory cell;

a digit line coupled with the first transistor of the memory cell and extending in a first direction;

a select line coupled with the second transistor of the memory cell, the select line configured to selectively couple the memory cell with the digit line;

a sense component configured to be selectively coupled with a plurality of digit lines that comprise the digit line; and a third transistor configured to selectively couple the digit line with the sense component, a gate of the third transistor coupled with the select line.

16. The memory device of claim 15, further comprising:

a second memory cell coupled with the word line and a second digit line of the plurality; and a fourth transistor configured to selectively couple the second digit line of the plurality with the sense component, a gate of the fourth transistor coupled with a second select line.

17. The memory device of claim 15, wherein the word line extends in a second direction orthogonal to the first direction.

18. The memory device of claim 17, wherein the first direction and the second direction are parallel to a surface of a substrate.

* * * * *